United States Patent
Chang et al.

(10) Patent No.: US 11,960,181 B2
(45) Date of Patent: Apr. 16, 2024

(54) ARRAY SUBSTRATE, DISPLAY PANEL AND DISPLAY

(71) Applicant: HKC CORPORATION LIMITED, Shenzhen (CN)

(72) Inventors: Hongyan Chang, Shenzhen (CN); Bing Han, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/334,544

(22) Filed: Jun. 14, 2023

(65) Prior Publication Data
US 2023/0324747 A1    Oct. 12, 2023

Related U.S. Application Data

(63) Continuation of application No. PCT/CN2022/106595, filed on Jul. 20, 2022.

(30) Foreign Application Priority Data

Dec. 2, 2021 (CN) .......................... 202111456673.4

(51) Int. Cl.
G02F 1/1362 (2006.01)
G02F 1/1345 (2006.01)
(Continued)

(52) U.S. Cl.
CPC ........ *G02F 1/13454* (2013.01); *G02F 1/1368* (2013.01); *H01L 27/124* (2013.01)

(58) Field of Classification Search
CPC ..................................................... G02F 1/1362
See application file for complete search history.

(56) References Cited

U.S. PATENT DOCUMENTS 5,399,889 A * 3/1995 Miyake ................ H04N 25/701
257/292
2007/0109232 A1 5/2007 Yamamoto et al.
(Continued)

FOREIGN PATENT DOCUMENTS

CN    104483771 A    4/2015
CN    108761929 A    11/2018
(Continued)

OTHER PUBLICATIONS

First Office Action issued in counterpart Chinese Patent Application No. 202111456673.4, dated Jan. 10, 2022.
(Continued)

*Primary Examiner* — Sang V Nguyen
(74) *Attorney, Agent, or Firm* — Westbridge IP LLC

(57) ABSTRACT

Disclosed are an array substrate, a display panel and a display. The array substrate is provided with a thin film transistor and a gate driving circuit. A trigger signal input terminal of the gate driving circuit corresponds to an output terminal of the thin film transistor, a first insulating layer is provided between a first metal layer corresponding to the output terminal of the thin film transistor and a second metal layer corresponding to the trigger signal input terminal of the gate driving circuit. A projected area of the first metal layer on the first insulating layer is partially overlapped with a projected area of the second metal layer on the first insulating layer.

9 Claims, 9 Drawing Sheets

(51) Int. Cl.
G02F 1/1368 (2006.01)
H01L 27/12 (2006.01)

(56) References Cited

U.S. PATENT DOCUMENTS

| | | | |
|---|---|---|---|
| 2016/0118409 A1* | 4/2016 | Jin | H01L 27/1248 |
| | | | 257/59 |
| 2017/0069265 A1 | 3/2017 | Zhou | |
| 2017/0343873 A1* | 11/2017 | Ma | G02F 1/136213 |
| 2022/0035212 A1* | 2/2022 | Wang | G09G 3/3614 |
| 2023/0177866 A1* | 6/2023 | Feng | H01L 27/14636 |
| | | | 382/124 |

FOREIGN PATENT DOCUMENTS

| | | |
|---|---|---|
| CN | 110518019 A | 11/2019 |
| CN | 110568686 A | 12/2019 |
| CN | 111508417 A | 8/2020 |
| CN | 113867062 A | 12/2021 |

OTHER PUBLICATIONS

International Search Report and Written Opinion issued in corresponding PCT Application No. PCT/CN2022/106595, dated Oct. 25, 2022.

* cited by examiner

ARRAY SUBSTRATE, DISPLAY PANEL AND DISPLAY

CROSS-REFERENCE TO RELATED APPLICATIONS

This application is a continuation application of International Application No. PCT/CN2022/106595, filed on Jul. 20, 2022, which claims priority to Chinese Patent Application No. 202111456673.4, filed on Dec. 2, 2021. The disclosures of the above-mentioned applications are incorporated herein by reference in their entireties.

TECHNICAL FIELD

The present application relates to the technical field of displays, and in particular to an array substrate, a display panel and a display.

BACKGROUND

The cut screen is designed to cut the panel at any size, however, since the trigger signal of the gate driving circuit is scanned from top to bottom, once it is cut, the gate driving circuit cannot be triggered, so generally, a frame starting signal line is added at the output terminal of each gate driving circuit, and a thin film transistor is arranged between the frame starting signal line and the gate driving circuit structure of each stage. One end of the thin film transistor is connected to the frame starting signal line, and another end of the thin film transistor is connected to the gate driving circuit structure. Once the screen is cut, the gate driving circuit of the first stage can only be triggered by the newly added frame starting signal line.

After the screen is cut at any size, the thin film transistor can become conductive by the laser fusion, then the signal in the frame starting signal line can input the starting signal to the after-cut first stage frame driving circuit through the thin film transistor so that the first stage frame driving circuit can be normally turned on. However, this kind of thin film transistor is prone to leak, because there is a flat capacitor at the connecting among the thin film transistor, the frame starting signal line and the gate driving circuit structure. When there is no need for cutting, the leakage is easy to occur at the connecting between the thin film transistor and other components, resulting in abnormal images displayed on the cut screen.

The above content is only used to assist in understanding the technical solution of the present application, and does not mean that the above content is the related art.

SUMMARY

The main purpose of the present application is to provide an array substrate, a display panel, and a display. The projected area of the first metal layer at the output terminal of the thin film transistor on the first insulating layer is partially overlapped with the projected area of the second metal layer at the input end of the gate driving circuit on the first insulating layer, which solves the technical problem in the related art that the thin film transistors are prone to leak and cause abnormal images displayed on the cut screen.

In order to realize the objective, the array substrate is provided with a thin film transistor and a gate driving circuit. A trigger signal input terminal of the gate driving circuit corresponds to an output terminal of the thin film transistor, a first insulating layer is provided between a first metal layer corresponding to the output terminal of the thin film transistor and a second metal layer corresponding to the trigger signal input terminal of the gate driving circuit. A projected area of the first metal layer on the first insulating layer is partially overlapped with a projected area of the second metal layer on the first insulating layer.

In an embodiment, the first metal layer is arranged at a position corresponding to the output terminal of the thin film transistor, and the output terminal is a source electrode or a drain electrode of the thin film transistor.

In an embodiment, the first metal layer is staggered with the second metal layer, and an overlapped area is formed between the projected area of the first metal layer on the first insulating layer and the projected area of the second metal layer on the first insulating layer.

In an embodiment, the first metal layer includes at least two first metal electrodes;
the second metal layer includes a same number of second metal electrodes as the first metal electrodes;
the first metal electrodes are arranged at intervals on a lower surface of the first insulating layer, and the second metal electrodes are arranged at intervals on an upper surface of the first insulating layer; and
an overlapped area is formed between the projected area of the first metal electrode on the first insulating layer and the projected area of two adjacent second metal electrodes at a corresponding position on the first insulating layer.

In an embodiment, the first metal electrodes are arranged at a preset distance on the lower surface of the first insulating layer, and the second metal electrodes are arranged at the preset distance on the upper surface of the first insulating layer.

In an embodiment, a frame start signal line is provided on the array substrate, the frame start signal line corresponds to the input terminal of the thin film transistor, and a second insulating layer is provided between a third metal layer corresponding to the input terminal of the thin film transistor and a fourth metal layer corresponding to the frame start signal line; and
a projected area of the third metal layer on the second insulating layer is partially overlapped with a projected area of a fourth metal layer on the second insulating layer.

In an embodiment, the third metal layer is arranged corresponding to the input terminal of the thin film transistor, the input terminal is a drain electrode or a source electrode of the thin film transistor, and the third metal layer is opposite to the first metal layer.

In an embodiment, when the first metal layer is provided at the source electrode of the thin film transistor, the third metal layer is provided at the drain electrode of the thin film transistor; or
when the first metal layer is provided at the drain electrode of the thin film transistor, the third metal layer is provided at the source electrode of the thin film transistor.

In an embodiment, the third metal layer is spaced and staggered with the fourth metal layer.

In an embodiment, the third metal layer includes at least two third metal electrodes;
the fourth metal layer includes a same number of fourth metal electrodes as the third metal electrodes;
the third metal electrodes are arranged at intervals on a lower surface of the second insulating layer, and the fourth metal electrodes are arranged at intervals on an upper surface of the second insulating layer; and an overlapped area is formed between the projected area of the third metal electrode on the second insulating layer and a projected area of two adjacent fourth metal electrodes at corresponding positions on the second insulating layer.

In an embodiment, the third metal electrodes are arranged at a preset distance on a lower surface of the second insulating layer, and the fourth metal electrodes are arranged at the preset distance on an upper surface of the second insulating layer.

In an embodiment, the first metal layer includes at least two first metal electrodes;
the second metal layer includes a same number of second metal electrodes as the first metal electrodes;
the first metal electrodes are arranged at intervals on the lower surface of the first insulating layer, and the second metal electrodes are arranged at intervals on the upper surface of the first insulating layer;
an overlapped area is formed between the projected area of the first metal electrode on the first insulating layer and a projected area of two adjacent second metal electrodes at corresponding positions on the first insulating layer;
the second insulating layer is provided between the third metal layer and the fourth metal layer;
the projected area of the third metal layer on the second insulating layer is partially overlapped with the projected area of the fourth metal layer on the second insulating layer.

In an embodiment, a plurality of thin film transistors are provided on the array substrate, and the output terminal of each thin film transistor corresponds to the trigger signal input terminal of the gate driving circuit at corresponding positions.

The present application also provides a display panel, by including: a color filter substrate, a liquid crystal layer and the array substrate. The liquid crystal layer is provided between the color filter substrate and the array substrate.

The present application also provides a display, including: a backlight module and the display panel. The backlight module is provided on a back of the display panel, and the backlight module is configured to provide a backlight light source for the display panel.

The present application provides an array substrate, a display panel, and a display. The array substrate is provided with a thin film transistor and a gate driving circuit. The trigger signal input terminal of the gate driving circuit corresponds to the output terminal of the thin film transistor. A first insulating layer is provided between the first metal layer corresponding to the output terminal of the thin film transistor and the second metal layer corresponding to the trigger signal input terminal of the gate driving circuit. The projected area of the first metal layer on the first insulating layer is partially overlapped with the projected area of the second metal layer on the first insulating layer. In the present application, the projected area of the first metal layer on the first insulating layer is partially overlapped with the projected area of the second metal layer on the first insulating layer, so that the facing area between the first metal layer of the thin film transistor and the second metal layer of the gate driving circuit is reduced, and the leakage risk of the thin film transistor can be reduced.

BRIEF DESCRIPTION OF THE DRAWINGS

In order to illustrate the technical solutions in the embodiments of the present application or in the related art more clearly, the following briefly introduces the accompanying drawings required for the description of the embodiments or the prior art. Obviously, the drawings in the following description are only the drawings corresponding to a first embodiment, a second embodiment, and a third embodiment of the array substrate, the embodiments of the display panel and the embodiments of the display of the present application. For those of ordinary skill in the art, other drawings can also be obtained according to the structures shown in these drawings without any creative effort.

The achievement of the purpose, functional characteristics and advantages of the present application will be further described with reference to the accompanying drawings in conjunction with embodiments.

DETAILED DESCRIPTION OF THE EMBODIMENTS

It should be understood that the embodiments are only used to illustrate the present application and are not used to limit the present application.

The technical solutions of the embodiments of the present application will be described in more detail below with reference to the accompanying drawings.

First Embodiment

Figure 1:
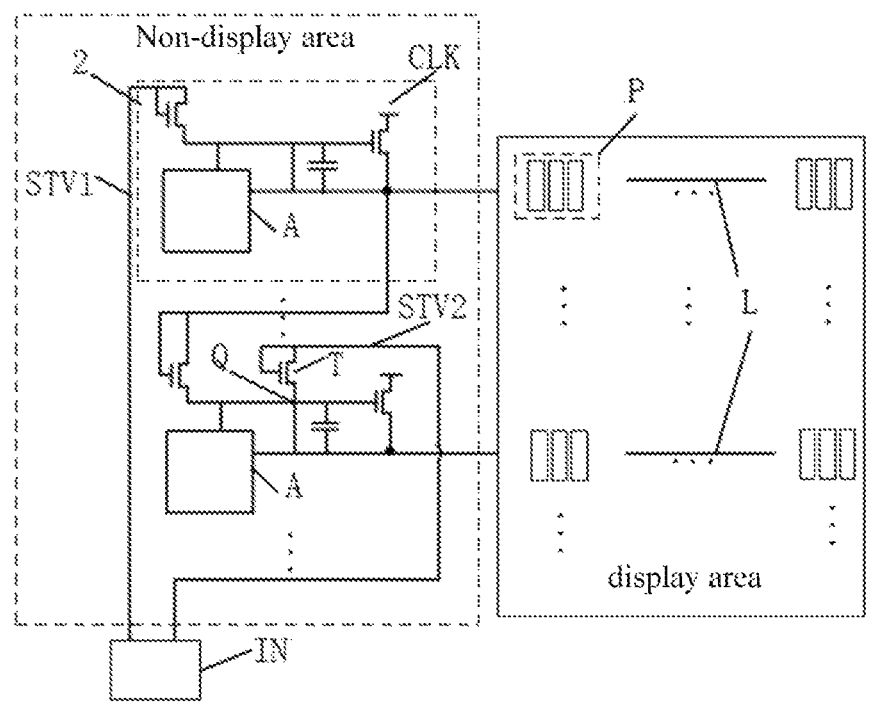
FIG. 1 is a top view of an array substrate of the present application.
Figure 2:
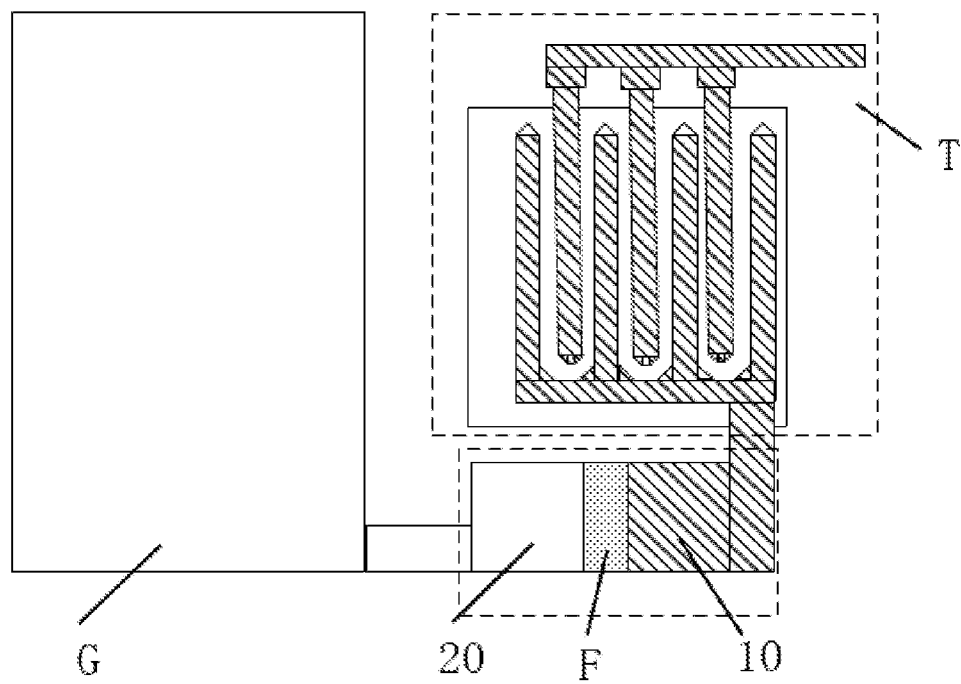
FIG. 2 is a schematic structural view of a thin film transistor and a gate driving circuit of an array substrate according to a first embodiment of the present application.
Figure 3:
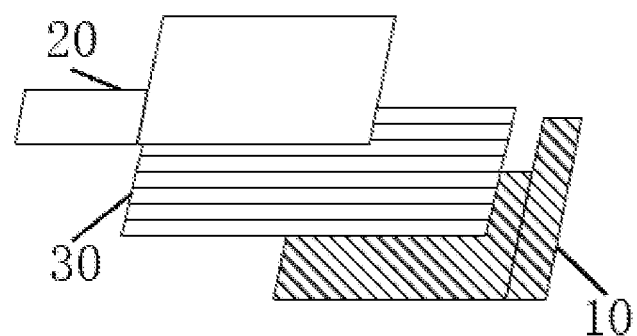
FIG. 3 is a schematic structural view of a connecting between the thin film transistor and the gate driving circuit of the array substrate according to the first embodiment of the present application.

As shown in FIG. 1, FIG. 2 and FIG. 3, FIG. 1 is a top view of an array substrate of the present application, FIG. 2 is a schematic structural view of a thin film transistor and a gate driving circuit of an array substrate according to a first embodiment of the present application, and FIG. 3 is a schematic structural view of a connecting between the thin film transistor and the gate driving circuit of the array substrate according to the first embodiment of the present application. As shown in FIG. 1, FIG. 2 and FIG. 3, in this embodiment, a thin film transistor T and a gate driving circuit G are provided on an array substrate, a trigger signal input terminal of the gate driving circuit G corresponds to a trigger signal output terminal of the thin film transistor T, and a first insulating layer 30 is provided between a first metal layer 10 corresponding to the output terminal of the thin film transistor T and a second metal layer 20 corresponding to the trigger signal input terminal of the gate driving circuit G.

As shown in FIG. 2 and FIG. 3, a projected area of the first metal layer 10 on the first insulating layer 30 is partially overlapped with a projected area of the second metal layer 20 on the first insulating layer 30.

In this embodiment, the gate driving circuit G is a circuit that drives the GOA to work normally. The gate driving circuit can receive the trigger signal sent by the frame starting signal line STV2 or the output terminal of an upper-stage gate driving circuit to turn on each row pixel. Both the first metal layer 10 and the second metal layer 20 are metal electrode layers, and the specific materials used for the metal electrode layers are not limited here. The first metal layer 10 is provided at a position corresponding to the output terminal of the thin film transistor T. The output terminal can be a source electrode or a drain electrode of the thin film transistor T. The first insulating layer 30 can be made of a galvanized material Gi, and can also be made of other insulating materials. The first metal layer 10 and the second metal layer 20 are usually opposite to each other in the related art, and a facing area is largest. Except for a partial metal of the first metal layer 10 in the thin film transistor T and a partial metal of the second metal layer 20 in the gate driving circuit G.

Figure 4:
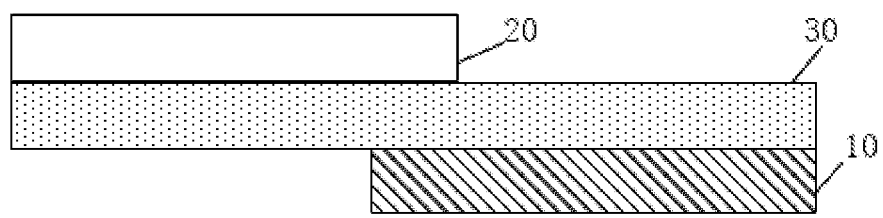
FIG. 4 is a cross-sectional view of the connecting between the thin film transistor and the gate driving circuit of the array substrate according to the first embodiment of the present application.

As shown in FIG. 4, in an embodiment, the first metal layer 10 is staggered with the second metal layer 20, but there must be an overlapped area between the projected area of the first metal layer 10 and the projected area of the second metal layer 20 on the first insulating layer 30 to ensure that the first metal layer 10 and the second metal layer 20 can be fused through the first insulating layer 30 by means of laser fusion, and the thin film transistor can work normally, that is, as long as there exists an overlapped area lager than 0 μm between the projected area of the first metal layer 10 and the projected area of the second metal layer 20 on the first insulating layer 30, the fusion between the first metal layer 10 and the second metal layer 20 can be realized, and the thin film transistor T can normally transmit the starting signal of the gate driving circuit G. In addition, in order to solve a leakage problem at the connecting between the thin film transistor T and the gate driving circuit G, the first metal layer 10 and the second metal layer 20 can be staggered so that the facing area between the first metal layer 10 and the second metal layer 20 is reduced. The reduction of the facing area between the first metal layer 10 and the second metal layer 20 can effectively reduce the leakage at the connecting between the thin film transistor T and the gate driving circuit G.

Figure 5:
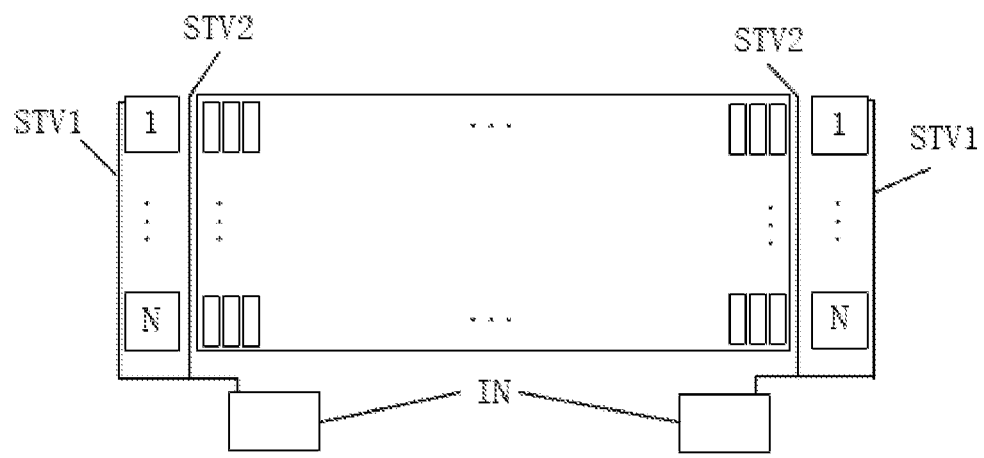
FIG. 5 is a schematic view of a frame starting signal line of an array substrate according to the first embodiment of the present application.

It should be understood that, on a display panel, a normal working process of the gate driving circuit G is to receive a trigger signal CLK to start a scanning unit to scan a red, green, blue (RGB) array on the display panel stage by stage. As shown in FIG. 5, the starting signal input terminal IN provides the trigger signal to the input terminal INPUT on a left or a right side of the first row of the RGB array through the frame starting signal line STV1 to turn on the transistor to start the scanning process. The thin film transistor T can also keep the signal input terminal Q of the gate driving circuit in a high level state, so as to turn on the transistor. After the scanning of the first row of RGB arrays is completed, a clock signal input terminal CLK can provide the trigger signal for a next row of the gate driving circuit G through the output terminal OUT of the gate driving circuit G to start a scanning of a second row of the RGB array. After the scanning of the second row of RGB arrays is completed, a clock signal input terminal CLK can also provide the trigger signal for a scanning process of a scanning unit corresponding to the gate driving circuit of a next stage, and so on until a scanning of an entire display panel is completed.

It should be noted that the cut screen can cut the size of the display panel. However, since the scanning process of the entire display panel is to scan from top to bottom, the trigger signal CLK is provided by the frame starting signal line STV1 for the gate driving circuit corresponding to the first row of RGB array. After the display screen is cut, a connecting between two rows of the RGB arrays is disconnected, and a corresponding trigger signal CLK cannot be provided to the gate driving circuit G of the RGB connected after the cut. As shown in FIG. 5, a frame starting signal line STV2 is added to two output terminals of one row of arrays, and the thin film transistor T is provided between the frame starting signal line STV2 and the gate driving circuit signal input terminal Q of a flip-flop structure of each row of RGB arrays. The input terminal of the thin film transistor T is connected to the frame starting signal line STV2, and the output terminal is connected to the signal input terminal Q of the gate driving circuit. Once the display screen is cut, the gate driving circuit G of the RGB connected after the cut can be triggered by the trigger signal CLK provided by the newly added starting signal line STV2.

In this embodiment, when one end of the thin film transistor T is connected to the gate driving circuit of the RGB array of a corresponding row, the first metal layer 10 of the thin film transistor T is connected to the second metal layer 20 of the gate driving circuit. When there is no need to cut the display screen, the first metal layer 10 of the thin film transistor T does not need to be connected to the second metal layer 20 of the gate driving circuit, and the first metal layer 10 and the second metal layer 20 form a flat capacitor structure, which is prone to leak.

The present application provides an array substrate, the thin film transistor and the gate driving circuit are provided on the array substrate, the trigger signal input terminal of the gate driving circuit corresponds to the output terminal of the thin film transistor, and the first insulating layer is provided between the first metal layer corresponding to the output terminal and the second metal layer corresponding to the trigger signal input terminal of the gate driving circuit. The projected area of the first metal layer on the first insulating layer is partially overlapped with the projected area of the second metal layer on the first insulating layer. In this embodiment, the projected area of the first metal layer on the first insulating layer is partially overlapped with the projected area of the second metal layer on the first insulating layer. In the present application, the projected area of the first metal layer on the first insulating layer is partially overlapped with the projected area of the second metal layer on the first insulating layer, so that the facing area between the first metal layer of the thin film transistor and the second metal layer of the gate driving circuit is reduced, and the leakage risk of the thin film transistor can be reduced.

Second Embodiment

Figure 6:
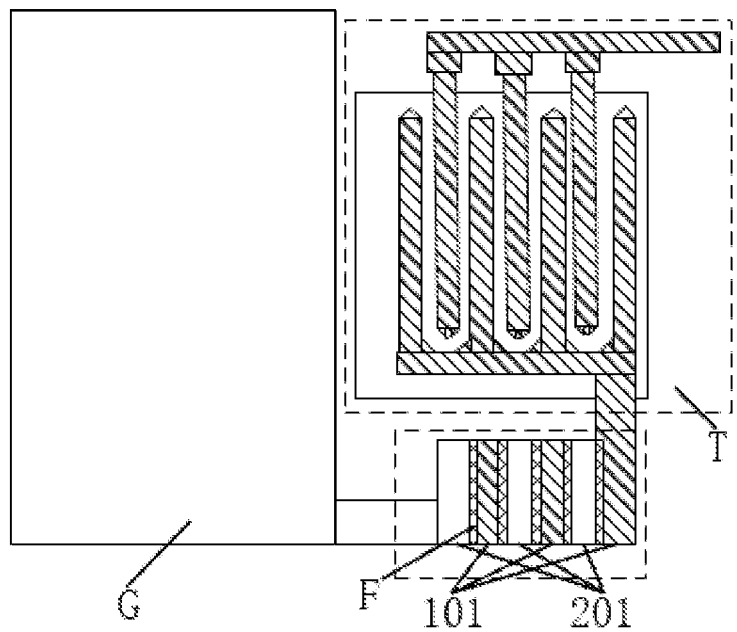
FIG. 6 is a schematic structural view of a thin film transistor and a gate driving circuit of an array substrate according to a second embodiment of the present application.

As shown in FIG. 6, FIG. 6 is a schematic structural view of a thin film transistor and a gate driving circuit of an array substrate according to a second embodiment of the present application. The second embodiment of the array substrate is provided based on FIG. 6.

In this embodiment, the first metal layer 10 includes at least two first metal electrodes 101, and the second metal layer 20 includes a same number of second metal electrodes 201 as the first metal electrodes 101. The first metal electrode 101 is arranged at intervals on a lower surface of the first insulating layer 30, and the second metal electrode 201 is arranged at intervals on an upper surface of the first insulating layer 30. An overlapped area is formed between the projected area of the first metal electrode 101 on the first insulating layer 30 and the projected areas of two adjacent second metal electrodes 201 at corresponding positions on the first insulating layer 30.

Figure 7:
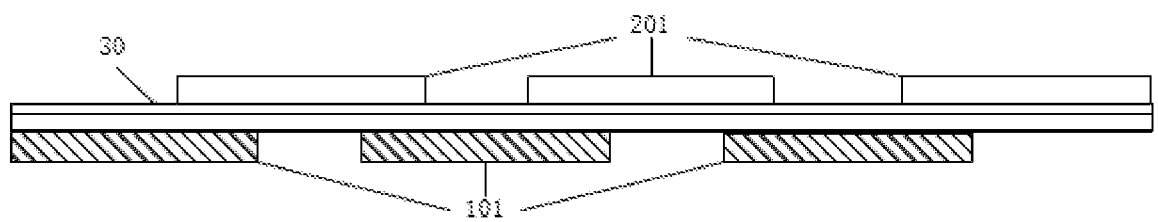
FIG. 7 is a cross-sectional view of a connecting structure between the thin film transistor and the gate driving circuit of an array substrate according to the second embodiment of the present application.

It should be noted that after the first metal electrode 101 is normally fused with the second metal electrode 201 by the laser, it can still normally transmit the trigger signal CLK. The first metal electrode 101 has the same function as the first metal layer 10. The first metal layer 10 may include a plurality of first metal electrodes 101, and a specific number of the first metal electrodes 101 can be set according to a size of the first metal layer 10. For example, the larger the first metal layer 10 is, the more the first metal electrode 101 may be set. As shown in FIG. 7, the first metal layer 10 including three first metal electrodes 101 is an example for illustration, but this embodiment does not limit the specific number of metal electrodes in the metal layer. The metal layer may include two metal electrodes, three metal electrodes, four metal electrodes, etc. In this embodiment, the specific size of the metal electrode is not limited, and the size of the metal electrode only needs to be larger than a precision of an exposure machine. For example, the precision of the exposure machine is 2 μm, then a length and a width of the metal electrode need to be greater than the precision of the exposure machine, that is, 2 μm.

It should be understood that, in this embodiment, the first metal electrode 101 can also be arranged on the upper surface of the first insulating layer 30, and the second metal electrode 201 can also be arranged on the lower surface of the first insulating layer 30, that is, a position relative to the first insulating layer 30 of the first motor 101 and the second metal electrode 201 may be altered by each other. Of course, all the first metal electrodes 101 are on one surface of the first insulating layer 30, and all the second metal electrodes 201 are on another surface of the first insulating layer. There is an overlapped area between the projections of the first metal electrode 101 and the second metal electrode 201 respectively on the first insulating layer 30. The smaller the overlapped area is, the lower the leakage risk will be. Therefore, the overlapped area between the projections of the first metal electrode 101 and the second metal electrode 201 on the first insulating layer 30 need to be as small as much as possible as long as the starting signal can be transmitted normally.

Figure 8:
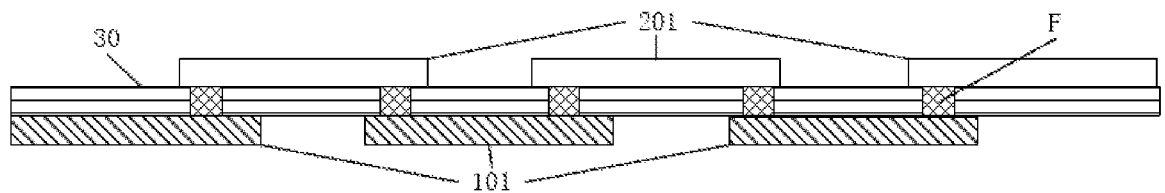
FIG. 8 is a schematic view of a connecting between a first metal electrode and a second metal electrode when the connecting between the thin film transistor and the gate driving circuit of the array substrate is conductive according to the second embodiment of the present application.

In an embodiment, as shown in FIG. 8, when the leakage occurs at the connecting between the thin film transistor T and the gate driving circuit G, a leakage current needs to pass through the first metal electrode 101 at the first, the second metal electrode 201 at the first, the first metal electrode 101 at the second, the second metal electrode 201 at the second, the first metal electrode 101 at the third and the second metal electrode 201 at the third to realize the leakage of the current. The leakage path requires that a fusion point F between the first metal electrode 101 and the second metal electrodes 201 is in a fusion state, and the fusion point is disposed on the first insulating layer 30. Through an arrangement between the first metal electrode 101 and the second metal electrode 201, a transmission path of the leakage current can be effectively increased. There will be no current leakage when one of the first metal electrodes 201 is not fused with the second metal electrode 201 at the corresponding position.

The plurality of first metal electrodes 101 and a corresponding number of second metal electrodes 201 are provided, when the thin film transistor T and the gate driving circuit G are normally connected and used, it is necessary to fuse the first metal electrode 101 with the second metal electrode 201 for multiple times. As shown in FIG. 8, the first metal electrode 101 under the first insulating layer 30 needs to be fused with the two second metal electrodes 201 at the corresponding positions, so as to realize the normal connecting between the thin film transistor T and the gate driving circuit G, and realize the normal transmission of the trigger signal CLK. In this embodiment, the more the first metal electrodes 101 and the second metal electrodes 201 are provided, the smaller the leakage current is. For example, when one first metal electrode 101 and one second metal electrode 201 are set, the leakage current may be at a level of 10^-12, and when two first metal electrodes 101 and two second metal electrodes 201 are set, the leakage current is 10^-24 level. The more the first metal electrodes 101 and the second metal electrodes 201 are set, the lower the risk of the electric leakage is.

In this embodiment, the first metal electrodes 101 are arranged on the lower surface of the first insulating layer 30 at a preset distance from each other, and the second metal electrodes 201 are arranged on the upper surface of the first insulating layer 30 at a preset distance from each other.

It should be noted that, in this embodiment, the length and width of the plurality of disconnected and isolated first metal electrodes 101 and second metal electrodes 201 are not specifically limited. The distance between adjacent first metal electrodes 101 must be greater than a unit precision of the exposure machine to avoid an abnormal display during an exposure. There is a certain overlapped area between the projected area of the first metal electrode 101 on the first insulating layer 30 and the projected area of the second metal electrode 201 on the first insulating layer 30, but a size of the overlapped area is not specifically limited. The preset distance refers to a distance between adjacent first metal electrodes 101 and adjacent second metal electrodes 201. The preset distance needs to be greater than the unit precision of the exposure machine. For example, the unit precision of the exposure machine is 2 um, and the preset distance needs to be greater than 2 um.

In this embodiment, the array substrate is also provided with the frame starting signal line STV2, the frame starting signal line is set corresponding to the input terminal of the thin film transistor T, and a second insulating layer 60 is provided between a third metal layer 40 corresponding to the input terminal of the thin film transistor T and a fourth metal layer 50 corresponding to the frame starting signal line. A projected area of the third metal layer 40 on the second insulating layer 60 is partially overlapped with a projected area of the fourth metal layer 50 on the second insulating layer 60.

Figure 9:
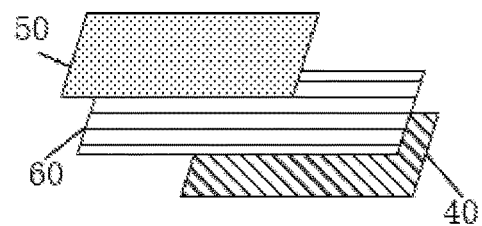
FIG. 9 is a schematic structural view of a connecting between the thin film transistor and a STV line of an array substrate according to the second embodiment of the present application.

It should be noted that the third metal layer 40 corresponds to the input terminal of the thin film transistor T, and the input terminal may be the drain electrode or the source electrode of the thin film transistor T. The third metal layer 40 is opposite to the first metal layer 10. When the first metal layer 10 is provided as the source electrode of the thin film transistor T, the third metal layer 40 is provided as the drain electrode of the thin film transistor T. Similarly, when the first metal layer 10 is provided as the drain electrode of the thin film transistor T, the third metal layer 40 is provided as the source electrode of the thin film transistor T. When the trigger signal CLK needs to be transmitted, the third metal layer 40 is connected to the fourth metal layer 50 provided by the frame starting signal line STV2. Of course, when the display screen need not to be cut, a plate capacitance is also formed between the third metal layer 40 and the fourth metal layer 50. As shown in FIG. 9, a first connecting area S1 is between the thin film transistor T and the frame starting signal line STV2. A second connecting area S2 is between the thin film transistor T and the gate driving circuit G.

As shown in FIG. 9, in an embodiment, the third metal layer 40 can be staggered with the fourth metal layer 50, and there is an overlapped area with the projected area of the fourth metal layer 50 on the second insulating layer 60 and the projected area of the third metal layer 40 on the second insulating layer 6. A facing area between the third metal layer 40 and the fourth metal layer 50 is as small as possible. The third metal layer 40 can be set as shown in the first metal layer 10, and the fourth metal layer 50 can also be set as shown in the second metal layer 20, which is not repeated here.

In this embodiment, the third metal layer 40 includes at least two third metal electrodes 401, and the fourth metal layer 50 includes a same number of fourth metal electrodes 501 as the third metal electrodes 401.

The third metal electrode 401 is arranged at intervals on a lower surface of the second insulating layer 60, and the fourth metal electrodes 501 is arranged at intervals on an upper surface of the second insulating layer 60.

There is an overlapped area between the projected area of the third metal electrode 401 on the second insulating layer 60 and the projected areas of two adjacent fourth metal electrodes 501 at corresponding positions on the second insulating layer 60.

It should be noted that the third metal layer 40 can be provided with at least two third metal electrodes 401, and the fourth metal layer 50 can also be provided with a same number of fourth metal electrodes 501 as the third metal electrodes 401, so as to increase the transmission path of the leakage current between the thin film transistor T and the frame starting signal line STV2, and can effectively reduce the leakage between the thin film transistor T and the frame starting signal line STV2. Only when the third metal electrode 401 and the corresponding fourth metal electrode 401 are both fused can a complete leakage circuit be formed, which may cause the leakage.

Figure 10:
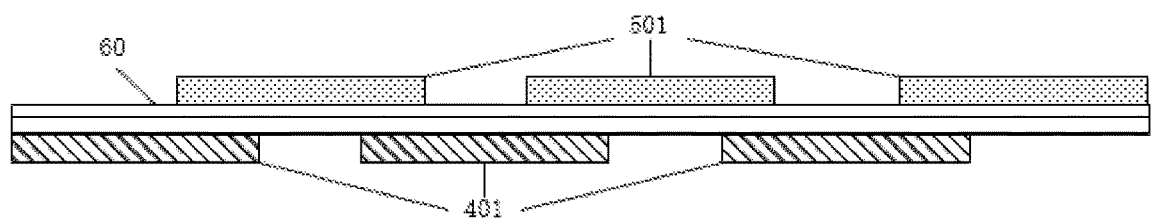
FIG. 10 is a cross-sectional view of the connecting between the thin film transistor and a STV line of the array substrate according to the second embodiment of the present application.

In an embodiment, as shown in FIG. 10, there is an overlapped area between the projected area of the third metal electrode 401 on the second insulating layer 60 and the projected area of two adjacent fourth metal electrodes 501 at corresponding positions on the second insulating layer 60, and the third metal electrode 401 and the fourth metal electrode 501 are arranged in sequence. When the leakage occurs at the connecting between the thin film transistor T and the frame starting signal line STV2, the leakage current needs to pass through the third metal electrode 401 at the first, the fourth metal electrode 501 at the first, the third metal electrode 401 at the second, the fourth metal electrode 501 at the second, and the third metal electrode 401 at the third and the fourth metal electrode 501 at the third to cause the current leakage.

In this embodiment, as shown in the arrangement, the third metal electrode 401 should also be arranged at a preset interval on the lower surface of the second insulating layer 60, and the fourth metal electrode 501 should be arranged at preset intervals on the upper surface of the second insulating layer 60. The positions of the third metal layer 40 and the fourth metal layer 50 on the second insulating layer may be exchanged. However, the distance between the third metal electrodes 401 and the distance between the fourth metal electrodes 501 also need to meet a requirement of the unit precision of the exposure machine, so as to avoid the abnormal display.

The present application provides an array substrate, the thin film transistor and the gate driving circuit are provided on the array substrate, the trigger signal input terminal of the gate driving circuit corresponds to the output terminal of the thin film transistor, and the first insulating layer is provided between the first metal layer corresponding to the output terminal and the second metal layer corresponding to the trigger signal input terminal of the gate driving circuit. The projected area of the first metal layer on the first insulating layer is partially overlapped with the projected area of the second metal layer on the first insulating layer. In this embodiment, the first metal electrode in the first metal electrode is staggered with the second metal electrode in the second metal layer, and there is an overlapped area between the projected areas of the first metal electrode on the first insulating layer and the two adjacent second metal electrodes at corresponding positions on the first insulating layer, which reduces the facing area between the first metal layer of the thin film transistor and the second metal layer of the gate driving circuit, increases the transmission path of the leakage current, and more accurately reduces the leakage risk of the thin film transistor.

Third Embodiment

The third embodiment of the array substrate of the present application is provided based on the first embodiment and the second embodiment above.

It should be noted that a specific process for the gate driving circuit to receive the driving signal is: the fourth metal electrode 501 of the fourth metal layer 50 is conductive with the third metal electrode 401 of the third metal layer 40, then the second metal electrode 201 of the second metal layer 20 is conductive with the first metal electrode 101 of the first metal layer 10, and the driving signal is input to the gate driving circuit G from the frame starting signal line STV2 through the thin film transistor T.

In this embodiment, the array substrate is provided with the first connecting area S1 between the thin film transistor T and the frame starting signal line STV2 and the second connecting area S2 between the thin film transistor T and the gate driving circuit G. At the first connecting area S1, the first metal layer 10 and the second metal electrode 20 are arranged according to that the projected area of the first metal layer 10 on the first insulating layer 30 is partially overlapped with the projected area of the second metal layer 20 on the first insulating layer 30. At the second connecting area S2, the third metal layer and the fourth metal layer are arranged according to that the projected area of the third metal layer on the second insulating layer is partially overlapped with the projected area of the fourth metal layer on the second insulating layer. At the first connecting area S1, at least two first metal electrodes 101 and at least two second metal electrodes 201 are arranged according to that the projected area of the first metal electrode 101 on the first insulating layer is partially overlapped with the projected areas of two adjacent second metal electrodes 201 at the corresponding positions on the first insulating layer, and at least two third metal electrodes 401 and at least two a fourth metal electrode 501 are arrange at the first connecting area S1 according to that the projected area of the first third metal electrode 401 on the second insulating layer 60 is partially overlapped with the projected areas of two adjacent fourth metal electrodes 501 at the corresponding positions on the second insulating layer 60.

In addition, besides the arrangement of the two electrode layers or electrodes at the first connecting area S1 and the second connecting area S2, the first metal layer 10 at the second connecting point S2 can also be provided with at least two second electrode layers, the second metal layer 20 is provided with at least two second metal electrodes 201, the first metal electrodes 101 are arranged at intervals on the lower surface of the first insulating layer 30, and the second metal electrodes 201 are arranged at intervals on the upper surface of the first insulating layer 30. There is an overlapped area between the projected area of the first metal electrode 101 on the first insulating layer 30 and the projected area of two adjacent second metal electrodes 201 at the corresponding positions on the first insulating layer 30. At this time, the second insulating layer 60 is provided between the third metal layer 40 and the fourth metal layer 50 of the first connecting area S1. The projected area on the second insulating layer 60 is partially overlapped with the projected area of the fourth metal layer 50 on the second insulating layer 60. Similarly, the projected area of the first metal layer 10 on the first insulating layer 30 in the second connecting area S2 is partially overlapped with the projected area of the second metal layer 20 on the first insulating layer 30, and the projected area of the third metal layer 40 on the second insulating layer 60 of the first connecting area S1 is partially overlapped with the projected area of the fourth metal layer 50 on the second insulating layer 60.

Figure 11:
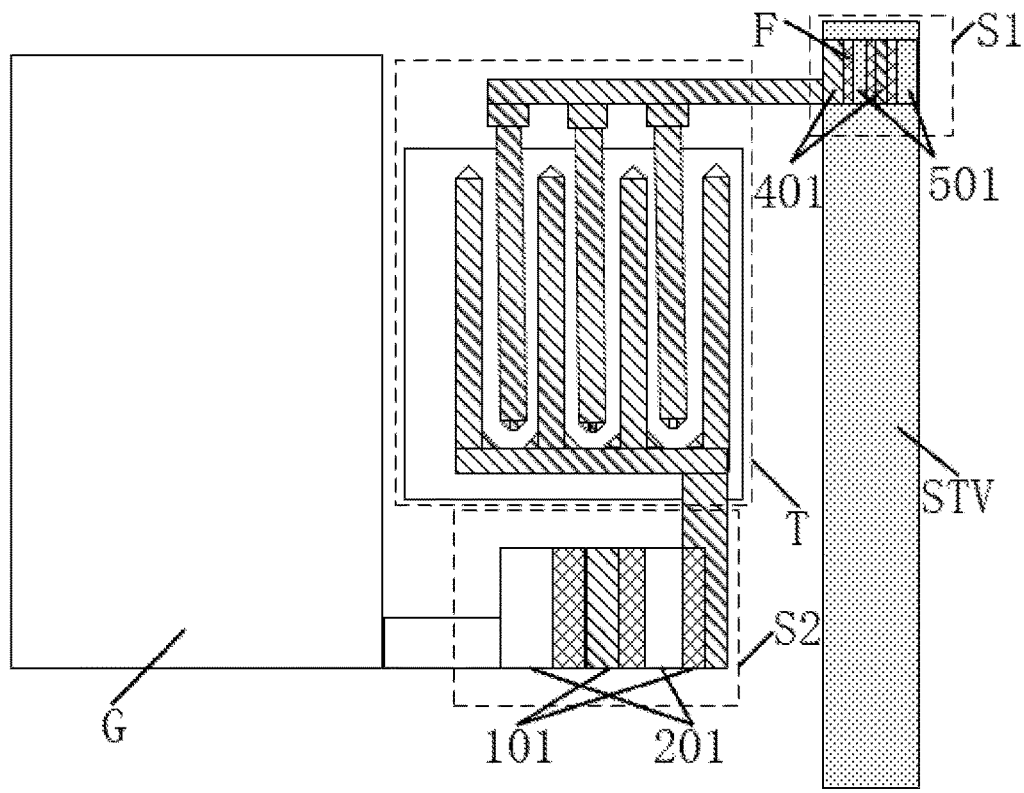
FIG. 11 is a first schematic structural view of a thin film transistor, a gate driving circuit and a frame starting signal line of an array substrate according to a third embodiment of the present application.
Figure 12:
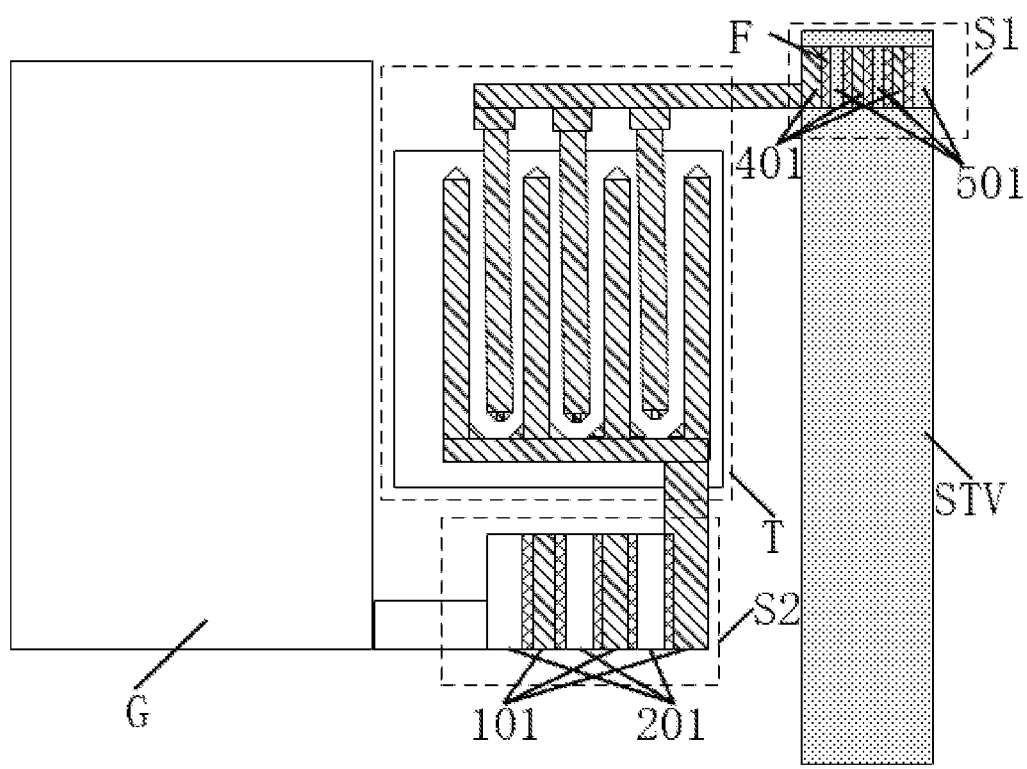
FIG. 12 is a second schematic structural view of a thin film transistor, a gate driving circuit and a frame starting signal line of an array substrate according to the third embodiment of the present application.
Figure 13:
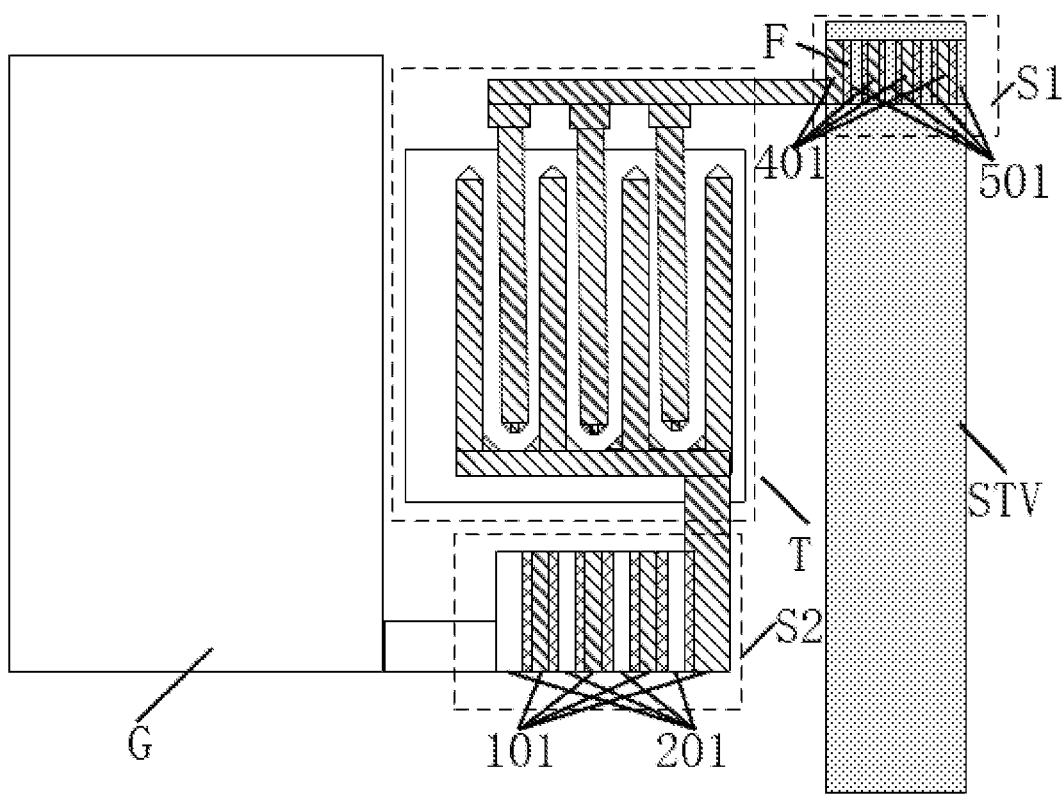
FIG. 13 is a third schematic structural view of a thin film transistor, a gate driving circuit and a frame starting signal line of an array substrate according to the third embodiment of the present application.

It should be understood that, in this embodiment, the first metal layer 10, the second metal layer 20, the third metal layer 40 and the fourth metal layer 50 at the first connecting area S1 and the second connecting area S2 are multi-metal electrode structures. As shown in FIG. 11, FIG. 12 and FIG. 13, in FIG. 11, the first metal layer 10 and the second metal layer 20 of the first connecting area S1 and the third metal layer 40 and the fourth metal layer 50 of the second connecting area S2 are both provided with two metal electrodes. In FIG. 12, the first metal layer 10 and the second metal layer 20 of the first connecting area S1 and the third metal layer 40 and the fourth metal layer 50 of the second connecting area S2 are both provided with three metal electrodes. In FIG. 13, the first metal layer 10 and the second metal layer 20 of the first connecting area S1 and the third metal layer 40 and the fourth metal layer 50 of the second connecting area S2 are both provided with four metal electrodes. A combination of the metal layers in the first connecting area S1 and the second connecting area S2 is not repeated here.

Figure 14:
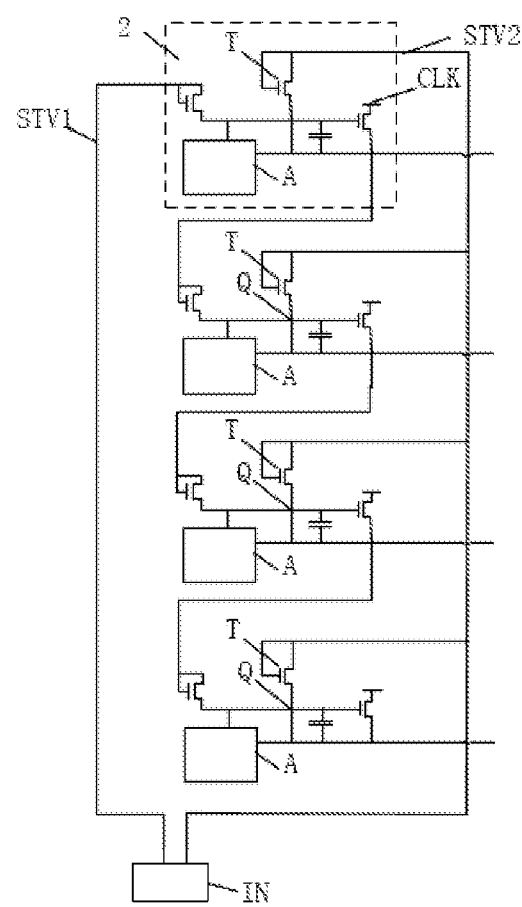
FIG. 14 is a schematic structural view of a plurality of thin film transistors in an array substrate according to the third embodiment of the present application.

As shown in FIG. 14, in this embodiment, the plurality of thin film transistors T are provided on the array substrate. The output terminal of each thin film transistor T is arranged corresponding to the trigger signal input terminal of the gate driving circuit G at corresponding positions.

As shown in FIG. 14, it should be noted that when a to-be-cut position of the display screen is determined, the thin film transistor can be arranged at the to-be-cut position, then the frame starting signal line STV2 can be connected to one end of the thin film transistor T, the gate driving circuit corresponding to the to-be-cut position is connected to another end of the thin film transistor T. Of course, a specific number of the thin film transistors can be determined according to a specific time of the display screen to be cut. For example, when the display screen needs to be cut twice, two thin film transistors need to be provided, and when the display screen needs to be cut three times, three thin film transistors need to be provided. Of course, the number of thin film transistors can also be set to be the same as the number of RGB array layers, so that the display screen can be cut from anywhere. The connection between each thin film transistor and the gate driving circuit and the connection between each thin film transistor and the STV line can refer to the above structure, and will not be repeated here.

In this embodiment, the array substrate is provided. Both ends of the thin film transistors on the array substrate are set as the electrode layer structure or the electrode structure, so that the leakage of the thin film transistor can be avoided from the first connecting area S1 between the thin film transistor and the frame starting signal line and the second connecting area S2 between the thin film transistor and the gate driving circuit.

Figure 15:
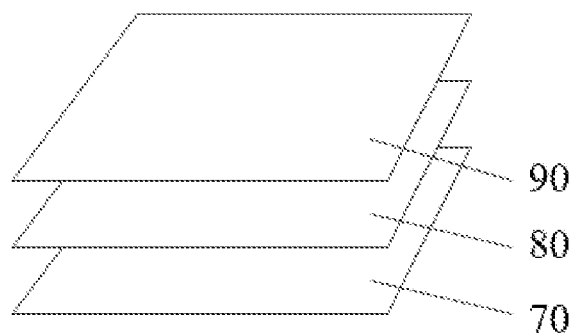
FIG. 15 is a schematic structural view of a display panel according to an embodiment of the present application.

In addition, the embodiment of the present application also provides a display panel. As shown in FIG. 15, FIG. 15 is a schematic structural view of a display panel according to an embodiment of the present application. The display panel includes the array substrate 70, a color filter substrate 90 opposite to the array substrate 70, and a liquid crystal layer 80 between the array substrate 70 and the color filter substrate 90.

Figure 16:
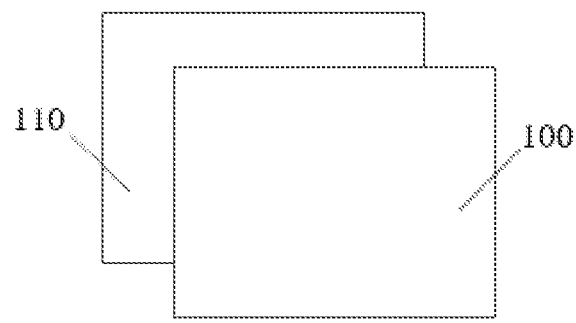
FIG. 16 is a schematic structural view of a display according to an embodiment of the present application.

In addition, the embodiment of the present application also provides a display. As shown in FIG. 16, FIG. 16 is a schematic structural view of a display according to an embodiment of the present application. The display includes the display panel 100 and a backlight module 110. The backlight module 110 is provided on a back of the display panel 100, and is used to provide a backlight source for the display panel 100.

Since the display adopts all the technical solutions of all embodiments, it has at least all the beneficial effects brought by the technical solutions of the embodiments, which will not be repeated here.

The above descriptions are only embodiments of the present application, and are not intended to limit the scope of the present application. Under the inventive concept of the present application, any equivalent structural transformations made by using the contents of the description and drawings of the present application, or direct/indirect disclosures in other related technical fields are included in the scope of patent protection of the present application.

It is obvious that the embodiments to be described are only some rather than all of the embodiments of the present application. All other embodiments obtained by persons skilled in the art based on the embodiments of the present application without creative efforts shall fall within the scope of the present application.

It should be noted that if there are directional indications, such as up, down, left, right, front, back, etc., involved in the embodiments of the present application, the directional indications are only used to explain a certain posture as shown in the accompanying drawings. If the specific posture changes, the directional indication also changes accordingly.

In addition, if there are descriptions related to "first", "second", etc. in the embodiments of the present application, the descriptions of "first", "second", etc. are only for the purpose of description, and should not be construed as indicating or implying relative importance or implicitly indicates the number of technical features indicated. Thus, a feature delimited with "first", "second" may expressly or implicitly include at least one of that feature. In addition, the technical solutions between the various embodiments can be combined with each other, but must be based on the realization by those of ordinary skill in the art. When the combination of technical solutions is contradictory or cannot be realized, it should be considered that the combination of such technical solutions does not exist or fall within the scope of the present application.

What is claimed is:

1. An array substrate, provided with a thin film transistor and a gate driving circuit, wherein:
    a trigger signal input terminal of the gate driving circuit corresponds to an output terminal of the thin film transistor, a first insulating layer is provided between a first metal layer corresponding to the output terminal of the thin film transistor and a second metal layer corresponding to the trigger signal input terminal of the gate driving circuit; and
    the first metal layer and the second metal layer are configured to be staggered so that a facing area between the first metal layer and the second metal layer is reduced;
    wherein the first metal layer comprises at least two first metal electrodes;
    the second metal layer comprises a same number of second metal electrodes as the first metal electrodes;
    the first metal electrodes are arranged at intervals on a lower surface of the first insulating layer, and the second metal electrodes are arranged at intervals on an upper surface of the first insulating layer; and
    an overlapped area is formed between the projected area of the first metal electrode on the first insulating layer and the projected area of two adjacent second metal electrodes at a corresponding position on the first insulating layer.

2. The array substrate of claim 1, wherein the first metal electrodes are arranged at a preset distance on the lower surface of the first insulating layer, and the second metal electrodes are arranged at the preset distance on the upper surface of the first insulating layer.

3. The array substrate of claim 2, wherein a frame start signal line is provided on the array substrate, the frame start signal line corresponds to the input terminal of the thin film transistor, and a second insulating layer is provided between a third metal layer corresponding to the input terminal of the thin film transistor and a fourth metal layer corresponding to the frame start signal line; and
    a projected area of the third metal layer on the second insulating layer is partially overlapped with a projected area of a fourth metal layer on the second insulating layer.

4. The array substrate of claim 3, wherein the third metal layer comprises at least two third metal electrodes;
    the fourth metal layer comprises a same number of fourth metal electrodes as the third metal electrodes;
    the third metal electrodes are arranged at intervals on a lower surface of the second insulating layer, and the fourth metal electrodes are arranged at intervals on an upper surface of the second insulating layer; and
    an overlapped area is formed between the projected area of the third metal electrode on the second insulating layer and a projected area of two adjacent fourth metal electrodes at corresponding positions on the second insulating layer.

5. The array substrate of claim 4, wherein the third metal electrodes are arranged at a preset distance on a lower surface of the second insulating layer, and the fourth metal electrodes are arranged at the preset distance on an upper surface of the second insulating layer.

6. The array substrate of claim 3, wherein the first metal layer comprises at least two first metal electrodes;
    the second metal layer comprises a same number of second metal electrodes as the first metal electrodes;
    the first metal electrodes are arranged at intervals on the lower surface of the first insulating layer, and the second metal electrodes are arranged at intervals on the upper surface of the first insulating layer;
    an overlapped area is formed between the projected area of the first metal electrode on the first insulating layer and a projected area of two adjacent second metal electrodes at corresponding positions on the first insulating layer;
    the second insulating layer is provided between the third metal layer and the fourth metal layer;
    the projected area of the third metal layer on the second insulating layer is partially overlapped with the projected area of the fourth metal layer on the second insulating layer.

7. The array substrate of claim 5, wherein a plurality of thin film transistors are provided on the array substrate, and the output terminal of each thin film transistor corresponds to the trigger signal input terminal of the gate driving circuit at corresponding positions.

8. A display panel, comprising:
    a color filter substrate;
    a liquid crystal layer; and
    the array substrate of claim 1,
    wherein the liquid crystal layer is provided between the color filter substrate and the array substrate.

9. A display, comprising:
    a backlight module; and
    the display panel of claim 8,
    wherein the backlight module is provided on a back of the display panel, and the backlight module is configured to provide a backlight light source for the display panel.

* * * * *